US005530299A

United States Patent [19]

Besslein et al.

[11] Patent Number: 5,530,299

[45] Date of Patent: Jun. 25, 1996

[54] METHOD OF DETERMINING MECHANICAL PARAMETERS OF AN ELECTRIC SWITCHING DEVICE

[75] Inventors: Bernd Besslein, Erlangen; Jürgen Nützel, Schweinfurt; Werner Reinert; Peter Zinn, both of Berlin, all of Germany

[73] Assignee: Siemens Aktiengesellschaft, Munich, Germany

[21] Appl. No.: 211,072

[22] PCT Filed: Aug. 26, 1992

[86] PCT No.: PCT/DE92/00687

§ 371 Date: May 16, 1994

§ 102(e) Date: May 16, 1994

[87] PCT Pub. No.: WO93/06612

PCT Pub. Date: Apr. 1, 1993

[30] Foreign Application Priority Data

Sep. 20, 1991 [DE] Germany .......................... 41 31 828.5

[51] Int. Cl.$^6$ .................................................. G01R 31/327

[52] U.S. Cl. .......................... 307/112; 307/116; 324/415; 340/644

[58] Field of Search .................................... 307/112, 113, 307/116, 117, 118, 119, 120; 324/415, 418, 423, 424; 361/236, 242; 340/644; 73/488

[56] References Cited

U.S. PATENT DOCUMENTS

| | | | |
|---|---|---|---|
| 4,400,981 | 8/1983 | Aoyagi et al. | 73/862.51 |
| 4,433,293 | 2/1984 | Aoyagi | 324/424 |
| 4,864,286 | 9/1989 | Ohshita et al. | 340/644 |
| 4,897,754 | 1/1990 | Konishi et al. | 361/1 |
| 5,117,189 | 5/1992 | Terminiello et al. | 324/415 |
| 5,182,517 | 1/1993 | Thelen et al. | 324/418 |

*Primary Examiner*—William M. Shoop, Jr.
*Assistant Examiner*—Jonathan S. Kaplan
*Attorney, Agent, or Firm*—Kenyon & Kenyon

[57] ABSTRACT

A method for determining mechanical parameters of an electric switching device exposed to environmental influences in which a measuring transmitter is provided for detecting the speed of a component of the drive means of the switch device at at least two consecutive times. In the case of vacuum power switches, the time of contact of the switch members and the time of the latching in the switched-on condition are preferably considered. If measurement values from comparative measurements of a given number of switches are available, the maximum intensity of a given environmental influence at which test sample can reliably operate is determined from a measurement of a test sample under normal environmental conditions.

7 Claims, 2 Drawing Sheets

METHOD OF DETERMINING MECHANICAL PARAMETERS OF AN ELECTRIC SWITCHING DEVICE

BACKGROUND OF THE INVENTION

The present invention relates to a method for determining mechanical parameters of an electric switching device exposed to environmental influences. The electric switching device has at least one energy storage device for preparing for a switch movement for switching-on, at least one switch chamber having switch contacts, a contact-force spring adapted to be cocked by the energy storage device upon the switching-on, and a drive device for transmitting a switch movement to the switch chamber.

Known methods of the above-mentioned type, such as methods used in the product testing departments of the electrical industry, serve to examine the manner of operation of the switching devices under the influence of the environment, thereby obtaining information as to whether the switching device is suitable for its intended use. Such investigations are important, in particular for the power switches of power engineering since the reliability of the general power supply depends upon the proper operation of such power switches. Influences of the environment such as air pressure, temperature, dirt, and similar influences can vary within wide limits and can affect the mechanical and/or electrical switching capability of an electric switch.

The object of the present invention is to develop a method of the above mentioned type which uses a simple test, carried out after the manufacture of a switching device, to predict whether the switching device is suitable for a given intended use.

SUMMARY OF THE INVENTION

The method of the present invention achieves this object by the following steps:

- providing a component of the drive device, which participates in the entire drive movement, with a measuring device for determining the speed of the component;
- imposing a selected environmental influence with a given intensity on the switching device;
- determining the dependence of the speed of the component on time; and
- repeating the measurement at different intensities of the selected environmental influence.

If a number of switching devices are examined by this method, it will be highly probable that a distribution of certain properties will be detected. This distribution is unavoidable even in instances of careful manufacture. For instance, variations in the energy content of spring storages, variations in the viscosity of lubricants, differences in the friction of bearings and similar phenomena as a function of the different intensity of an environmental influence will be detected. All of these influences affect the speed of operation of the drive means of the switching device. For instance, the speed towards the end of the switching-on movement can be used as a criterion for the evaluation. If the speed is not sufficiently great, then a latching, necessary to maintain the switched-on condition, does not take place and the switching device returns entirely or partly into the switched-off condition.

In accordance with one embodiment of the present invention, determining the speed of the moving component of the drive device at a large number of times is not necessary.

Rather, comparing the speeds measured during a switching process at least two successive times during the movement of the component and repeating this step for all measurements is sufficient.

Despite limiting the number of measurements to two points in time, a high degree of certainty as to the behavior of the drive means can be obtained in accordance with a further development of the present invention by the following steps:

- determining the speed of the component at the time when the switch contacts of the switch chamber contact each other in the course of the switching movement; and
- determining the speed of the component at the time when the switched-on position is latched, thereby securing it. In this way, whether sufficient residual energy is still available towards the end of the switching-on process to latch the drive means with the switch contacts of the switching device properly closed can be predicted.

Based on the method steps explained above, currently manufactured switching devices can be tested by measuring them with a normal value of the selected environmental influence. Further, to obtain the permissible range of use of the switching device, the values ascertained are compared with reference values obtained from measurements with variable values of the environmental influence selected.

DETAILED DESCRIPTION

Figure 1:
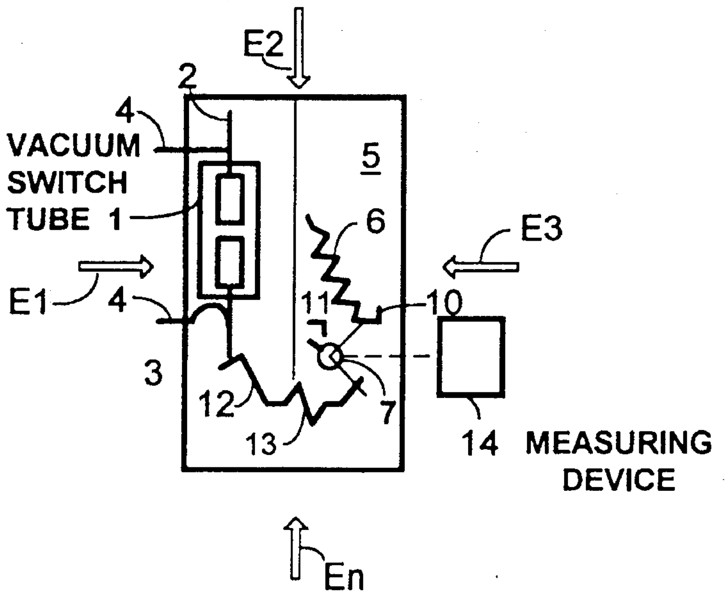
FIG. 1 diagrammatically illustrates a vacuum power switch as example of switching devices to be examined.

FIG. 1 shows, as example of a type of switching device to be examined, a vacuum power switch such as used in the voltage range of about 6 to 36 kV and for rated disconnect currents of up to about 50,000 A. The main components of such a power switch include a vacuum switch tube 1 having a stationary connection stud 2, a movable connection stud 3, connecting rails 4 connected to the connection studs 2 and 3, and a drive means 5. The drive means 5 contains an "on" spring 6 and a switch shaft 7 which receives the energy of the "on" spring 6 and mechanically transfers the energy to one or more vacuum switch tubes 1. FIG. 1 shows the "off" position of the power switch in which the switch shaft 7 is locked by an "on" pawl 10. If the "on" pawl 10 is released, the rotation of the switch shaft 7, which then commences, is transmitted, via a lever mechanism 12, to the movable connection stud 3 of the vacuum switch tube 1 for switching-on (i.e., for closing the switch). In the lever mechanism 12 shown, a contact-force spring 13, cocked during the course of the switching-on movement, is inserted to maintain a predetermined contact force between the switch contacts of the vacuum switch tube 1.

In FIG. 1, arrows E1, E2, E3 and En indicate various environmental factors which act on the power switch and influence its manner of operation. One possible result of such influences is that a disconnect pawl 11, indicated in FIG. 1, which cooperates with the switch shaft 7, cannot function properly. As a result of such a malfunction, the "on" position of the power switch is not completely reached.

To carry out the method of the present invention, which will be explained in further detail below, the power switch 1 is provided, in accordance with FIG. 1, with a measuring device 14. The measuring device 14 permits the speed of the switch shaft 7 to be determined. The measuring device 14 can, for example, comprise an inductive displacement pick-up such as those customary in electrical engineering product test departments.

Figure 2:
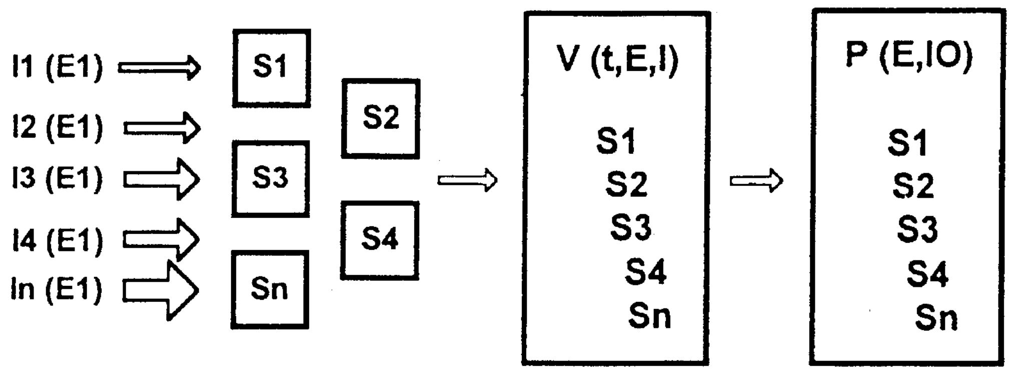
FIG. 2 is a block diagram illustrating the procedure of the present invention upon obtaining measurement values for the properties of switching devices.

FIG. 2 shows that a plurality of power switches bearing the symbols S1, S2, S3, S4 and Sn are available. The number, n, of power switches to be examined can be any number desired, but should not be too small to obtain sufficiently reliable results. The power switches S1 to Sn are exposed to environmental influences which are caused to act, in each case, with different intensity. In FIG. 2, it is assumed that a given environmental influence E1, which may, for instance, be the air pressure or the temperature, is caused to act in different intensities I1, I2, I3, I4 and In. The designation In indicating that the entire possible spectrum of intensities is available with a desired or necessary fine gradation. The power switches S1 to Sn are now examined with measuring devices associated with them (corresponding to the measuring device 14 in FIG. 1). Measured values for the speed as a function of the time (t), the nature of the environmental influence (E), and the intensity of this environmental influence (I) are obtained as the test results. From these measured values for the speed (which are provided with the simplified designation v(t, E, I) in FIG. 2), values for the switch energy P (namely corresponding to the simplified designation P(E, I) in the right-hand block of FIG. 2) as a function of the nature of the environmental influence and its intensity can be obtained by calculation or comparative association.

Figure 3:
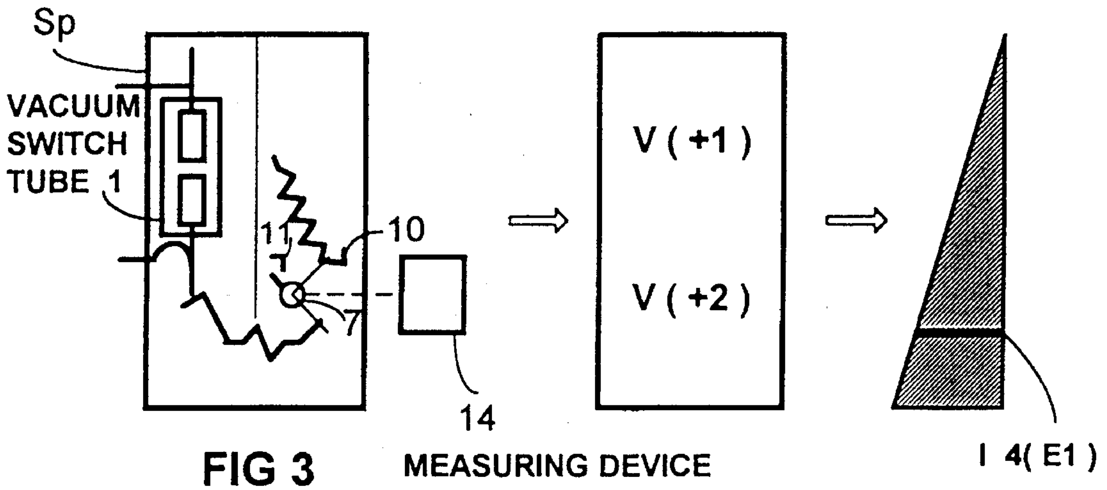
FIG. 3 is a block diagram illustrating the procedure of the present invention upon testing a switching device taken from current manufacture.

After a sufficient number of measured values for the speed at different times and a corresponding number of measured values for the energy of the drive at different times and also as a function of the nature of the environmental influence and its intensity are obtained, the examination of a currently manufactured power switch merely requires a measuring and evaluating process which is easy to carry out. For this, FIG. 3 shows a power switch Sp (corresponding to FIG. 1) with a measuring device 14. The measuring device 14 is adapted, in particular, to detect the speed of rotation of the switch shaft 7 at a time t1 and at a further time t2. The time t1 corresponds to the time of contact of the switch contacts of the vacuum switch tube 1 during the course of the switching-on process and the time t2 corresponds to the time of the engagement of the disconnect pawl 11. By comparing the previously obtained measured values, the maximum intensity of a given environmental influence at which the power switch Sp can still be used can directly be determined.

As example of an evaluation, FIG. 3 shows that the power switch Sp is dependable in operation up to the intensity 14 of the environmental influence E1.

Figure 4:
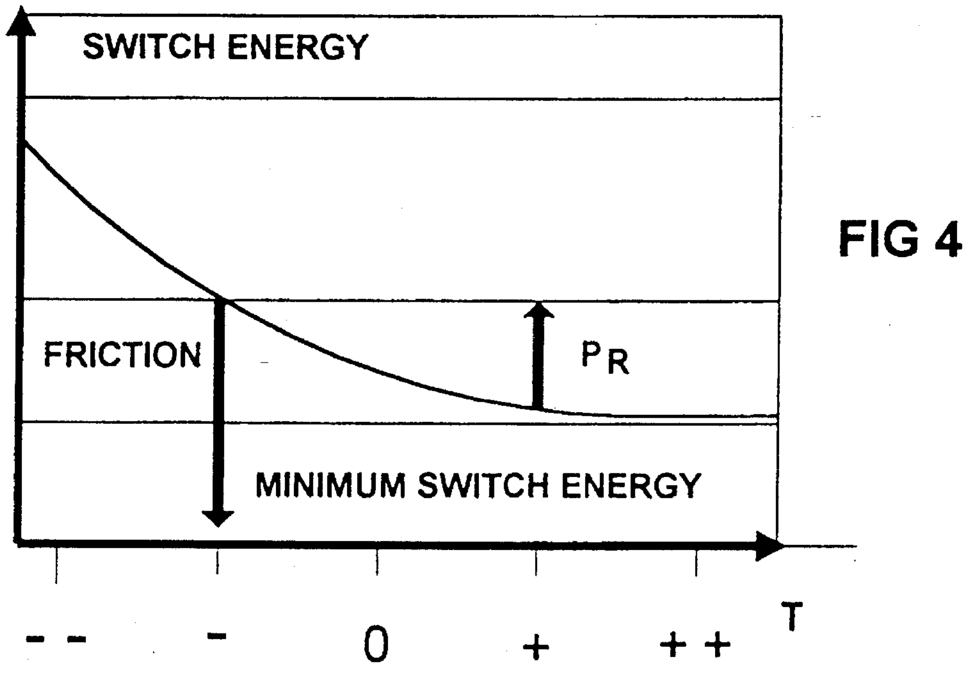
FIG. 4 is a graph showing the dependence of the energy of the drive means of a switching device as a function of a given environmental influence.

FIG. 4 shows the energy balance of a power switch of the above type as a function of the temperature as example for one of the environmental influences which occur. In the graph, the switch energy is plotted over the temperature range. Low temperatures are marked "– –" and higher temperatures are marked "++". "–", "0" and "+" are intermediate values. In the upper part of the graph, a straight line has been entered as limit line for the available energy supply.

Furthermore, in the lower part of the graph, the minimum required switch energy is also shown in the form of a straight line. The dependence of the internal friction of the power switch in question on the temperature is shown by a curve which drops from the left to the right. The residual energy in the drive of the power switch, which differs as a function of the temperature, is indicated by an arrow bearing the designation PR between the curve and a reference line parallel to the temperature axis. The limit for the range of use of the power switch is obviously reached at the point where the residual energy assumes the value, "0".

Figure 5:
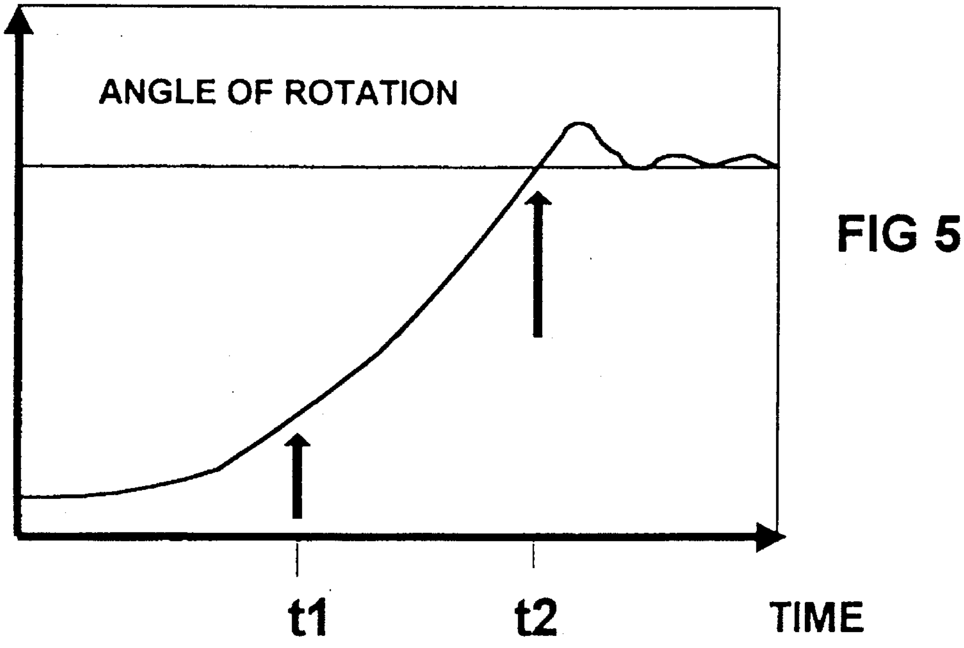
FIG. 5 is a diagram showing the angle of rotation of the switch shaft as a function of time.

In FIG. 5, the angle of rotation of the switch shaft 7 of a power switch in accordance with FIG. 1 is plotted as a function of the time. The curve shown in FIG. 5 passes, at the time t2, above a reference line drawn parallel to the time axis and approaches this line after overshooting it one or more times. The exceeding of the reference line in this connection characterizes the moment that the disconnect pawl 11 in FIG. 1 engages. If sufficient energy were not present at this time, the latching would not be effective and the power switch would not definitely reach its "on" position.

The time t1, which characterizes the time of contact of the switch contacts of the vacuum switch tube 1 upon switching-on, is also shown in FIG. 5. By determining only these two times t1 and t2, friction measurement values, which are applicable for a given type of power switch, can be obtained by the method in accordance with FIG. 2, these values being available for comparison upon the testing of a power switch taken from manufacture in accordance with FIG. 3. In this way, the permissible field of use of a power switch can be easily determined.

The use of the present invention is not limited to vacuum power switches, but can also be used, without any basic change, in switching devices with switch chambers of other types for instance with sulfur hexafluoride or some other extinguishing gas. Similarly, the method described is suitable for the examining of power switches having drive means which, in the place of springs, contain other energy storage devices, for instance hydraulic or pneumatic storage devices.

We claim:

1. A method of determining mechanical parameters of an electric switching device which is to be exposed to environmental influences and which has at least one energy storage device that prepares for a switch movement for switching-on, at least one switch chamber having switch contacts, a contact-force spring adapted to be cocked by the energy storage device upon the switching-on, and a drive device, said drive device transmits a switch movement to the switch chamber, comprising steps of:

a) providing a measuring transmitter to determine a speed of a component of the drive device that participates in an entire drive movement;

b) imposing a selected environmental influence on the switching device with a given intensity;

c) determining the speed of the component as a function of time; and d) repeating the measurement of steps a) through c) with different intensities of the environmental influence.

2. The method of claim 1 further comprising steps of:

e) comparing at least two speeds measured during a switching process at least two successive times during the movement of the component with each other; and f) repeating the comparing in step (e) for all measurements.

3. The method of claim 2 further comprising steps of:

g) determining the speed of the component at a time that the switch contacts of the switch chamber contact each other during a course of the switch movement; and h) determining the speed of the component at a time that a latching, which secures the "on" position, is active.

4. The method of claim 1 further comprising steps of:

e) subjecting a switching device from current manufacture to a measurement at a normal value of the selected environmental influence; and f) comparing said normal values obtained in step (e) with reference values from measurements with variable values of the selected environmental influence to obtain a permissible field of use of the switching device.

5. A method for determining mechanical parameters of an electric switching device which is to be exposed to environmental influences and which has an energy storage device that initiates a switch movement for closing the switch, a switch chamber having switch contacts, a contact-force spring adapted to be cocked by the energy storage device upon the initiation of the switch closing, a drive device, said drive device transmits the switch movement to the switch chamber, and a latch, said latch secures the switch in the closed position, comprising steps of:

a) providing a measuring device for measuring an angular rotation and an angular velocity of the drive device;

b) applying an environmental factor, at a number n of intensities to n electric switch devices;

c) repeating said applying step (b) for different environmental factors;

d) obtaining a switch velocity at a particular time for each intensity of each environmental factor with the measuring device; and e) determining a switch power for each intensity of each environmental factor based on the switch velocities obtained in step (d).

6. A method for determining mechanical parameters of an electric switching device which is to be exposed to environmental influences and which has an energy storage device that initiates a switch movement for closing the switch, a switch chamber having switch contacts, a contact-force spring adapted to be cocked by the energy storage device upon the initiation of the switch closing, a drive device, said drive device transmits the switch movement to the switch chamber, and a latch, said latch secures the switch in the closed position, comprising steps of:

a) providing a measuring device for measuring an angular rotation and angular velocity of the drive device;

b) applying an environmental factor, at a number n of intensities to the number n of electric switch devices;

c) obtaining a switch velocity at a first time and at a second time for each intensity of the environmental factor with the measuring device; and d) comparing a switch power for each intensity of the environmental factor based on the switch velocities obtained in step (c) with a measurement of switch under normal environmental conditions; and e) determining the maximum intensity of the environmental influence at which the switch can reliably operate based on the comparison of step (d).

7. The method of claim 6 wherein the first time is a time of contact of the switch members and the second time is a time of latching the switch closed.

* * * * *